United States Patent [19]

Matsumoto et al.

[11] Patent Number: 4,504,848
[45] Date of Patent: Mar. 12, 1985

[54] SOLID STATE IMAGE SENSOR WITH OVER-FLOW CONTROL

[75] Inventors: Hiroyuki Matsumoto; Toshio Kato, both of Atsugi, Japan

[73] Assignee: Sony Corporation, Tokyo, Japan

[21] Appl. No.: 616,800

[22] Filed: Jun. 5, 1984

Related U.S. Application Data

[63] Continuation of Ser. No. 318,559, Nov. 5, 1981.

[30] Foreign Application Priority Data

Nov. 10, 1980 [JP] Japan .................. 55-157831

[51] Int. Cl.³ .................. H01L 29/78; H01L 27/14; H01L 31/00; G11C 19/28
[52] U.S. Cl. ........................... 357/24; 377/58; 357/30; 357/89
[58] Field of Search ............... 357/24, 30; 377/57–63

[56] References Cited

U.S. PATENT DOCUMENTS

| 3,789,267 | 1/1974 | Krambeck et al. | 357/24 R |
| 3,863,065 | 1/1975 | Kosonocky et al. | 357/30 |
| 3,896,474 | 7/1975 | Amelio et al. | 357/24 M |
| 4,032,952 | 6/1977 | Ohba et al. | 357/24 M |
| 4,151,539 | 4/1979 | Barron et al. | 357/24 M |
| 4,229,752 | 10/1980 | Hynecek | 357/24 M |
| 4,362,575 | 12/1982 | Wallace | 357/24 M |
| 4,365,261 | 12/1982 | Chatterjee et al. | 357/24 M |

Primary Examiner—Gene M. Munson
Attorney, Agent, or Firm—Hill, Van Santen, Steadman & Simpson

[57] ABSTRACT

A solid state image sensor, in which the same gate voltage is applied through a gate insulating layer to a channel area and an over-flow control gate area, both provided in a semiconductor substrate, is disclosed. In this case, the substrate concentration adjacent the area beneath the over-flow control gate area is made different from that adjacent the area beneath the channel area to reduce the gate voltage dependency of the potential at the over-flow control gate area as compared with that at the channel area, whereby the maximum handling charge upon the charge transfer mode is made more than that upon the light receiving mode.

1 Claim, 6 Drawing Figures

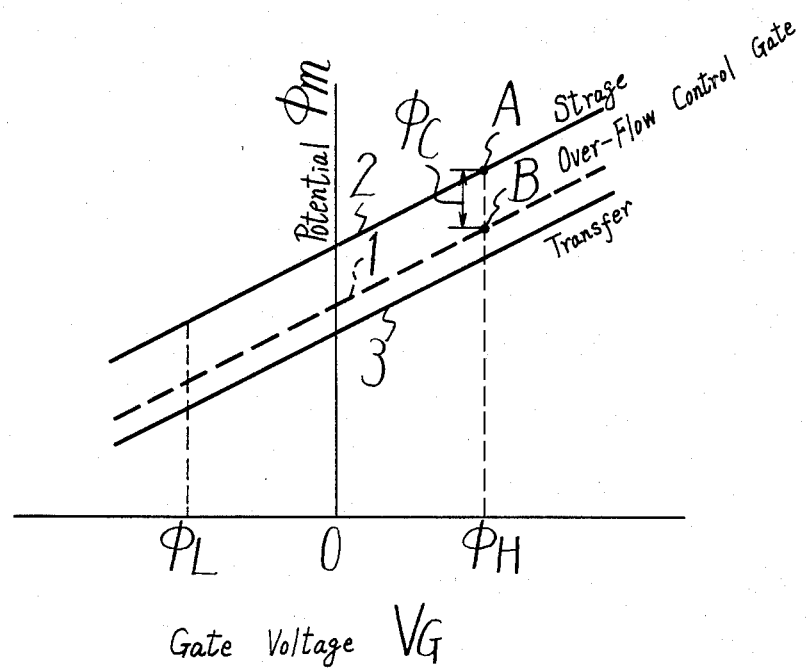

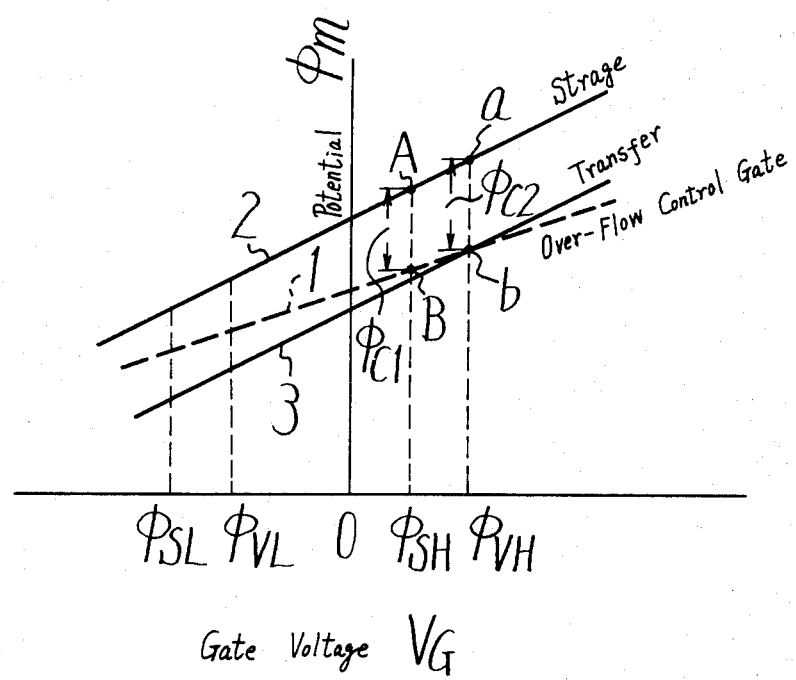

SOLID STATE IMAGE SENSOR WITH OVER-FLOW CONTROL

This application is a continuation of application Ser. No. 318,559, filed Nov. 5, 1981.

BACKGROUND OF THE INVENTION

1. Field of the Invention

The present invention relates generally to a solid state image sensor using a CCD (charge coupled device), and is directed more particularly to a solid state image sensor to reduce the generation of picture defects (grey vertical lines in a displayed image) which are caused by such a case where an over-flow drain area, which will absorb and remove an excess charge, is provided so as to suppress a blooming phenomenon at the image portion thereof.

2. Description of the Prior Art

In a CCD solid state image sensor of the frame transfer system, if its image portion is formed of a buried channel type, there appears a blooming phenomenon for an intensive light impinging thereon. To avoid this defect, adjacent a channel area, serving also as a light receiving area, along each vertical line in the image portion, provided are an over-flow control gate area and an over-flow drain area to absorb an excess charge, which is generated when the intensive light is received, to the over-flow drain area passed through the potential barrier of the over-flow control gate area. At this time, a potential, i.e. potential 1 of the over-flow control gate area is set between a potential 2 at a storage area in the channel area and a potential 3 at a transfer gate area as shown in the graph of FIG. 1. However, a potential difference $\emptyset_c$ thereof (difference between potentials A and B i.e. maximum handling charge) is constant without being dependent on a gate voltage $V_G$ applied to a gate electrode (a so-called transfer electrode). In other words, this means that as the image portion the maximum handling charge during the light receiving period becomes equal to the maximum handling charge during the charge transfer period.

Now, let it be assumed that, as shown in FIG. 2, the maximum handling charge at each of picture elements 4 of the image portion all have the capacity of "10" and the maximum handling charge of each of picture elements corresponding to a stage [4] and at a channel area B has only the capacity of "9" due to some reasons. Thus, during the light receiving mode, the stages [1], [2] and [3] of the channel B each can store the charge amount of "10" but only the stage [4] stores the charge amount of "9". Since, however, upon charge transfer mode, in the stage [4] of the channel area B only the charge amount of "9" is handled without depending on the gate voltage as shown in FIG. 1, if the charge transfer direction is taken as indicated by an arrow y in FIG. 2, the charge amounts at the stages [1], [2] and [3] are each suppressed as the charge amount of "9" when they pass through the stage [4]. As a result, after the stage [4] of the channel B, the charges become less than the inherent charges or so-called defects of grey vertical lines appears on a picture screen.

OBJECTS AND SUMMARY OF THE INVENTION

Accordingly, an object of the present invention is to provide a solid state image sensor free from the defects encountered in the prior art.

Another object of the invention is to provide a solid state image sensor in which a normal charge at every picture element can be completely transferred.

A further object of the invention is to provide a solid state image sensor without any defect in a reproduced picture or high in picture quality.

According to the present invention there is provided a solid state image sensor in which the same gate voltage is applied through a gate insulating layer to a channel area and an over-flow channel gate area, each provided in a semiconductor substrate, which is characterized in that a substrate concentration adjacent an area beneath said over-flow control gate area is made different from a substrate concentration adjacent an area beneath said channel area, whereby a gate voltage dependency of a potential at said over-flow control gate area is reduced as compared with that at said channel area and that a maximum handling charge upon a charge transfer mode is made more than a maximum handling charge upon a light receiving mode.

The other objects, features and advantages of the present invention will become apparent from the following description taken in conjunction with the accompanying drawings through which the like references designate the same elements and parts.

BRIEF DESCRIPTION OF THE DRAWINGS

FIG. 1 is a characteristic graph showing the gate voltage dependency of the potentials at a channel area and an over-flow control gate area in a prior art solid state image sensor;

FIG. 2 is a schematic diagram showing the image portion of a prior art solid state image sensor used to explain the generation of a defective picture;

FIG. 3 is a schematic diagram showing the image portion of an example of the solid state image sensor according to the present invention;

FIG. 4 is a characteristic graph showing the gate voltage dependency of the potential at the channel area and the over-flow control gate area of the solid state image sensor according to the invention;

DESCRIPTION OF THE PREFERRED EMBODIMENT

Figure 5:
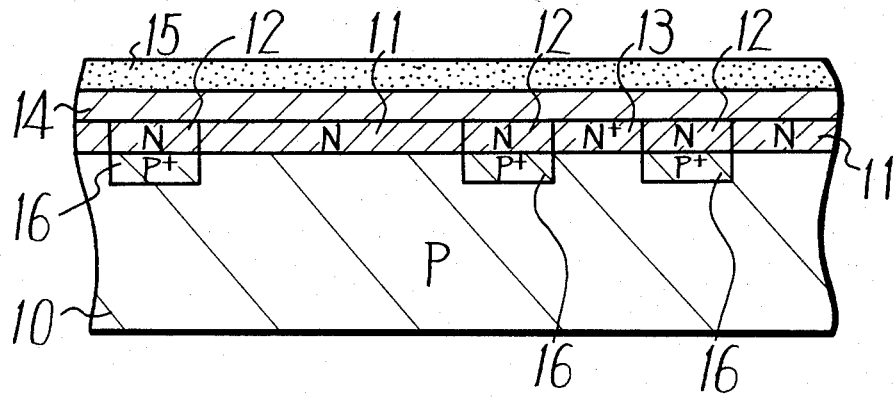
FIG. 5 is a cross-sectional view showing the image portion of an example of the invention.

Hereinbelow, an example of the solid state image sensor according to the present invention will be described.

The defects of grey vertical lines are caused by the fact that the maximum handling charge at the light receiving mode is same as the maximum handling charge at the charge transfer mode. Therefore, if the maximum handling charge at the charge transfer mode is selected to be more than that at the light receiving mode, the grey vertical lines can be converted to grey spots to make the defect on a reproduced picture not so conspicuous. That is, as shown in FIG. 3, it is formed that when the maximum handling charge of each picture element 4 upon the normal light receiving mode is taken as, for example, "10", the maximum handling charge upon the charge transfer mode is more than the former, for example, "12". Thus, even when a defect is caused in the stage [4] of the channel area B by some reasons and hence the maximum handling charge becomes "9" upon the light receiving mode and "11"

upon the charge transfer mode, the normal charge amounts "10" at the other stages [1], [2] and [3] can be completely transferred. Therefore, no defect of grey vertical lines appears until the maximum handling charge becomes less than "10".

According to the present invention, in order to realize the above characteristics, in a solid state image sensor with a semiconductor substrate which comprises therein a plurality of channel areas serving also as a light receiving area, an over-flow drain area absorbing and removing an excess charge in the channel area, and an over-flow control gate area arranged between the channel area and the over-flow drain area and restricting the flow-out level of the excess charge (i.e. restricting the maximum handling charge amount) and in which the same gate voltage (including the gate voltage upon the light receiving mode and the clock voltage upon the transfer mode) is applied to the channel area and the over-flow control gate area through an insulating layer, the gate voltage dependency of the potential at the over-flow control gate area is selected to be less than that of the potential in the channel area. That is, as shown in the graph of FIG. 4, for gate voltage characteristics 2 and 3 of the potentials at the storage gate area and the transfer gate area of the channel area, the gate voltage characteristic 1 of the potential at the over-flow control gate area is so selected that the characteristic 1 intersects at least the characteristic 3 at the transfer gate area to reduce the gate voltage dependency. According to the above, if the gate voltage upon the light receiving mode is taken as $\phi_{SH}$, a potential difference $\phi_{C1}$ between the storage gate area and the over-flow control gate area is the potential A minus potential B. While, if the clock voltage upon the charge transfer mode is taken as $\phi_{VH}$, its voltage difference $\phi_{C2}$ at that mode is potential a minus potential b, i.e. $\phi_{C1} < \phi_{C2}$ is established. Thus, the maximum handling charge upon the charge transfer mode can be made more than that upon the light receiving mode. In this case, however, as will be apparent from FIG. 4, the clock voltage $\phi_{VH}$ upon the charge transfer mode is so selected that it includes the points intersected with the characteristic 1 of the over-flow control gate area and that 3 of the transfer gate area and it is higher than the gate voltage $\phi_{SH}$.

In order to reduce the gate voltage dependency of the potential at the over-flow control gate area as compared with that of the potential at other channel, the substrate concentration adjacent the area beneath the over-flow control gate area is made different from that adjacent the area beneath the channel area. For example, when the channel area is made of buried channel type, the substrate concentration beneath the over-flow control gate area is selected to be high.

Figure 6:
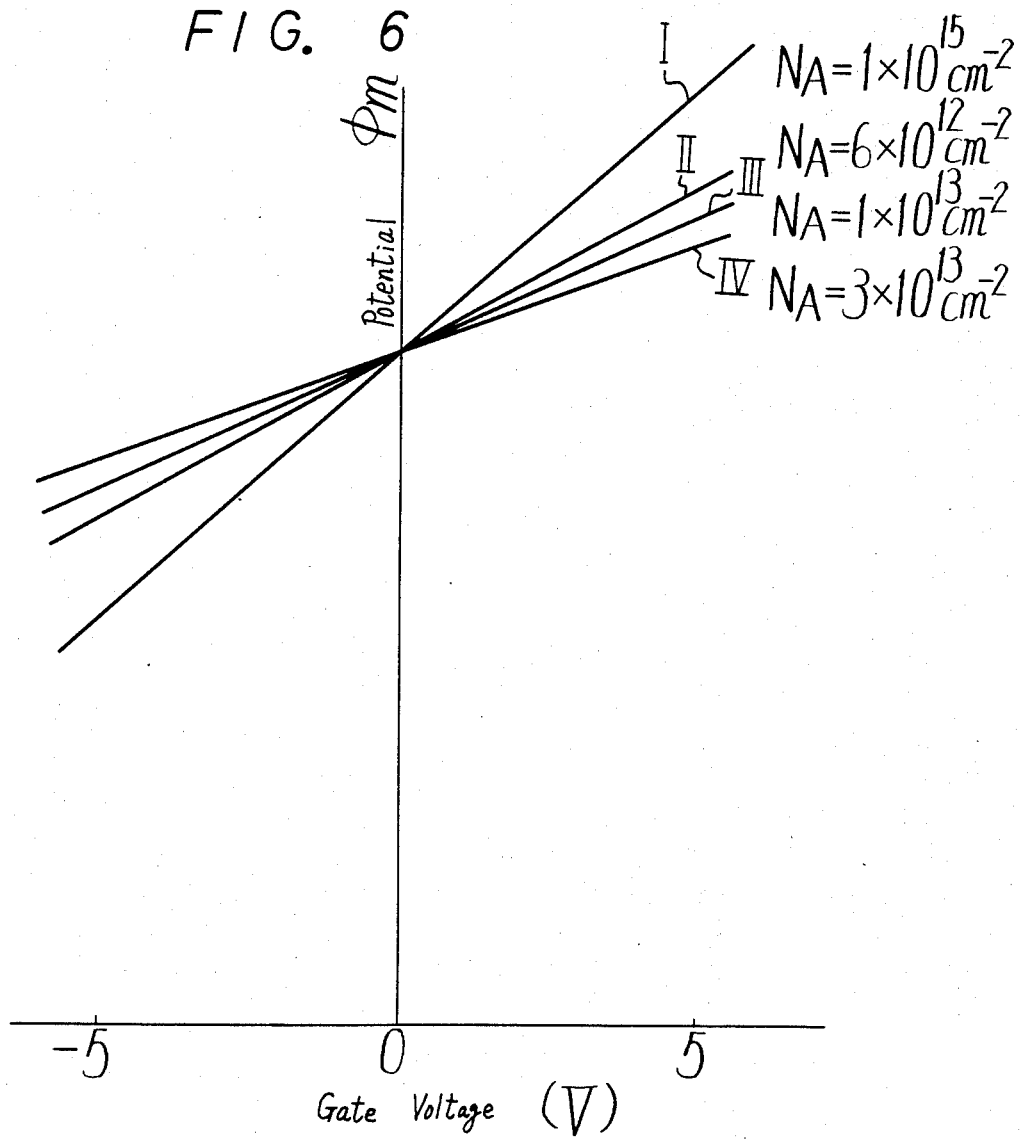
FIG. 6 is a potential to gate voltage characteristic graph with the substrate concentrations as parameter.

FIG. 6 is a characteristic graph showing the gate voltage dependency of the potential at an N-type semiconductor layer in such a case where the N-type semiconductor layer of $5 \times 10^{12}$ cm$^{-2}$ (dose amount) is formed on the surface of a P-type silison substrate and a gate electrode is formed thereon through a gate oxidization layer with the thickness of about 1000 Å and in which the impurity concentration of the P-type silicon substrate is varied. In this case, the absolute value is normalized.

In the graph of FIG. 6, characteristics (I), (II), (III) and (IV) show the cases where the substrate concentration $N_A$ is selected as $1 \times 10^{15}$ cm$^{-2}$, $6 \times 10^{12}$ cm$^{-2}$, $1 \times 10^{13}$ cm$^{-2}$ and $3 \times 10^{13}$ cm$^{-2}$ at the dose amount, respectively. As will be apparent from the characteristic graph of FIG. 6, by selecting the substrate concentration suitably, the gate voltage dependency of the potential at the N-type semiconductor layer can be varied.

FIG. 5 shows an example of the solid state image sensor according to the present invention which is a CCD solid state image sensor of the frame transfer system in which its image portion is made of a buried channel type. FIG. 5 shows the image portion mainly. In this example, on one of the major surfaces of, for example, P-type silicon substrate 10 formed is a semiconductor area i.e. channel area 11 so as to form an N-type buried channel, and in order to separate the channel area 11 into a plurality of vertical lines formed are N-type over-flow control gate areas 12. Adjacent the N-type over-flow control gate area 12, formed is an N$^+$-type over-flow drain area 13 for absorbing the excess charges in the channel area 11. A gate insulating layer 14 with a necessary thickness and made of, for example, SiO$_2$ is formed on the substrate 10 and a transfer gate electrode 15 made of, for example, polycrystalline silicon is formed on the gate insulating layer 14 so as to be used for applying a necessary transfer clock voltage upon the charge transfer mode. Further, in the example of FIG. 5, beneath only the over-flow control gate areas 12 provided are P-type high concentration areas 16 to make the substrate concentration beneath the over-flow control gate areas 12 high.

According to the example of the invention with the construction set forth above, the concentration of the substrate beneath the over-flow control gate areas 12 is made higher than that beneath the channel area 11 so that, as shown in the graph of FIG. 4 by the characteristic 1 the gate voltage dependency of the potential at the over-flow control gate area 12 is reduced as compared with that at the channel area 11. Accordingly, for example, if the gate voltage during the light receiving mode is taken as $\phi_{SH}$ and the clock voltage during the charge transfer mode as $\phi_{VH}$, the maximum handling charge during the charge transfer mode becomes more than that during the light receiving mode and hence the normal charge at every picture element can be completely transferred. Thus, the defects of grey vertical lines as in the prior art can be avoided from a reproduced picture.

The above description is given to the case where the invention is applied to the solid state image sensor of the buried channel type, but the invention can be applied to a solid state image sensor of the surface channel type with the same effect.

As described above, according to the present invention, the substrate concentration beneath the over-flow control gate area is controlled to reduce the gate voltage dependency of the potential at the over-flow control gate area, whereby the maximum handling charge becomes more during the charge transfer mode than during the light receiving mode. Therefore, even if there is a picture element whose maximum handling charge is less than those of the other picture elements, the normal charges of the other picture elements can be completely transferred so that a solid state image sensor with no defects of grey vertical lines or high in picture quality can be provided.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

We claim as our invention:

1. An electrical charge transfer device comprising a solid state image sensor having a plurality of aligned channel regions, overflow control gate regions and overflow drain regions comprising a substrate of a first conductivity type, said channel regions, said overflow gate control regions and said overflow drain regions comprising material of a second conductivity type and overlying said substrate, and areas of first conductivity type which has a higher impurity concentration than said substrate under said overflow control gate regions, an insulating layer formed over said channel regions, said overflow control gate regions and said overflow drain regions, and a transfer gate formed on said insulating layer over said channel regions, said overflow control gate regions and said overflow drain regions for transferring charges and wherein the maximum charge that can be handled during charge transfer mode is greater than the maximum charge during the light receiving mode.